US011240942B2

(12) United States Patent
Smith et al.

(10) Patent No.: US 11,240,942 B2
(45) Date of Patent: Feb. 1, 2022

(54) CONTROL OF IONIC COOLING IN WIRELESS CHARGING SYSTEMS

(71) Applicant: Integrated Device Technology, Inc., San Jose, CA (US)

(72) Inventors: Nicholaus Wayne Smith, La Mesa, CA (US); Tao Qi, San Diego, CA (US); Amit D. Bavisi, Los Gatos, CA (US); Changjae Kim, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 258 days.

(21) Appl. No.: 16/385,813

(22) Filed: Apr. 16, 2019

(65) Prior Publication Data

US 2019/0394906 A1 Dec. 26, 2019

Related U.S. Application Data

(60) Provisional application No. 62/687,693, filed on Jun. 20, 2018.

(51) Int. Cl.
| | |
|---|---|
| *H05K 7/20* | (2006.01) |
| *H02J 7/02* | (2016.01) |
| *H02J 7/00* | (2006.01) |
| *H02J 50/10* | (2016.01) |
| *H01F 38/14* | (2006.01) |
| *H02J 50/90* | (2016.01) |
| *H02J 50/60* | (2016.01) |

(52) U.S. Cl.
CPC ......... *H05K 7/20909* (2013.01); *H01F 38/14* (2013.01); *H02J 7/0042* (2013.01); *H02J 7/025* (2013.01); *H02J 50/10* (2016.02); *H02J 50/60* (2016.02); *H02J 50/90* (2016.02); *H05K 7/20945* (2013.01)

(58) Field of Classification Search
CPC . H05K 7/20909; H05K 7/20945; H02J 50/90; H02J 50/10; H02J 50/60; H02J 7/0042; H02J 7/025; H01F 38/14
USPC .......................................................... 320/108
See application file for complete search history.

(56) References Cited

U.S. PATENT DOCUMENTS

| | | | |
|---|---|---|---|
| 2016/0134129 A1* | 5/2016 | Watanabe ............... | H02J 7/025 307/104 |
| 2016/0190850 A1* | 6/2016 | Jeganathan ............. | H02J 50/10 320/108 |
| 2016/0218559 A1* | 7/2016 | Mehas ..................... | H02J 50/60 |
| 2016/0329735 A1* | 11/2016 | Helberg .................. | H02J 50/12 |
| 2017/0047784 A1* | 2/2017 | Jung ........................ | H02J 50/80 |
| 2018/0072182 A1* | 3/2018 | Araki ....................... | H02J 50/00 |
| 2019/0014683 A1* | 1/2019 | Han ......................... | H02J 50/10 |
| 2019/0229550 A1* | 7/2019 | Kim ......................... | H02J 50/80 |
| 2019/0333676 A1* | 10/2019 | Shin ........................ | H01F 27/105 |
| 2020/0091755 A1* | 3/2020 | Larsson ................... | H02J 7/0044 |

\* cited by examiner

*Primary Examiner* — Suresh Memula

(74) *Attorney, Agent, or Firm* — Haynes and Boone, LLP

(57) ABSTRACT

In accordance with some embodiments of the present invention, an ion cooling engine (ICE) controlled by a transmitting or receiving device cools a transmit or receive coil and possibly other parts of a wireless power transmitter or receiver system. In some embodiments, the ICE includes a low-voltage circuit controlled by the transmitting device and coupled to a high voltage circuit that generates the airflow. Other features are also provided.

19 Claims, 3 Drawing Sheets

CONTROL OF IONIC COOLING IN WIRELESS CHARGING SYSTEMS

CROSS REFERENCE TO RELATED APPLICATIONS

The present application claims priority to U.S. provisional patent application No. 62/687,693, filed Jun. 20, 2018, incorporated herein by reference.

TECHNICAL FIELD

Embodiments of the present invention are related to wireless power systems and, specifically, to cooling of such systems.

DISCUSSION OF RELATED ART

Typically, a wireless power system includes a transmitter coil that is driven to produce a time-varying magnetic field and a receiver coil, which can be part of a device such as a cell phone, PDA, computer, or other device, that is positioned relative to the transmitter coil to receive the power transmitted in the time-varying magnetic field. Often, there is heat buildup in the transmit coils as a result of the charging process. Cooling the system by conventional means (e.g., mechanical fans) can consume a large amount of power and is noisy, disrupting the environment in which the charger is installed, and is prone to mechanical failure.

Therefore, there is a need to develop systems that can more efficiently cool the charging system.

SUMMARY

Some embodiments of the present invention cool the transmitter and/or receiver by an ion cooling engine (ICE). In some embodiments, the ICE includes a low voltage circuit controlled by a transmitter, possibly by a controller in the transmitter (possibly a controller implemented on a chip). In some embodiments, a wireless power transmitter system includes such a transmit control chip and a low-voltage ion cooling engine circuit coupled between the transmit control chip and a high-voltage ion cooling engine circuit.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
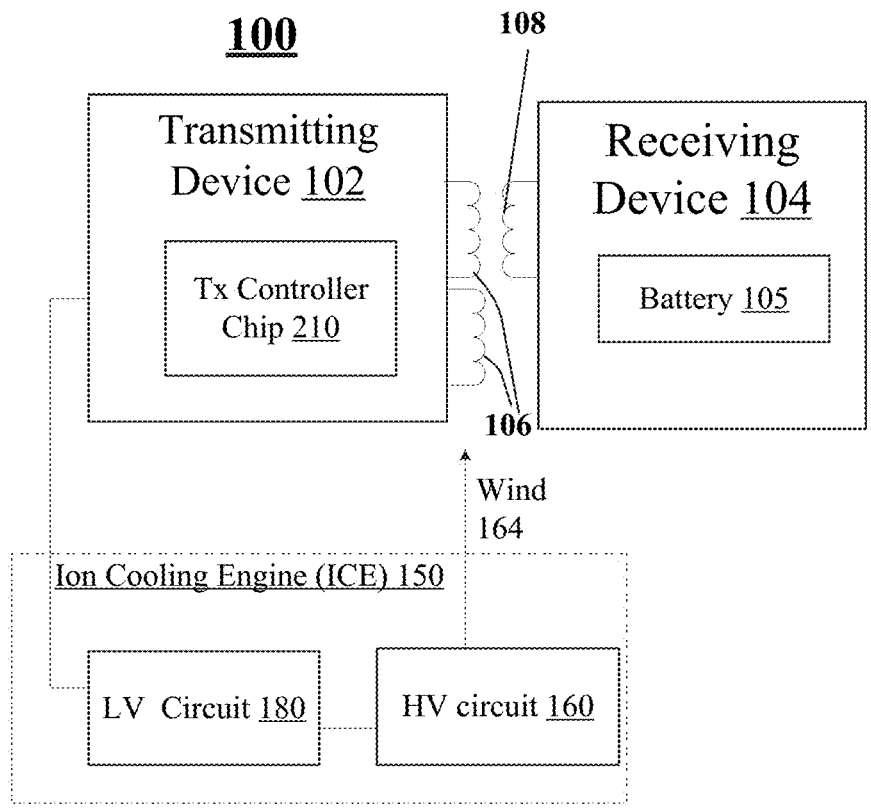
FIG. 1 illustrates a wireless power transfer system in accordance with some embodiments.

FIG. 1 illustrates an example wireless power transmission system 100. A transmitting device 102 is coupled to drive a transmission coil 106 to produce a time varying magnetic field. The time varying magnetic field induces a current in receive coil 108. Receive coil 108 is coupled to receiving device 104, which receives the transmitted wireless power and uses that power to charge one or more batteries 105. Transmitting device 102 may be coupled to multiple transmission coils 106, and may drive any one or more of the coils 106 at any given time to transfer power to one or more receive coils 108. For example, the transmitting device 102 may drive those transmission coils 106 that are in proper alignment with the receive coil(s) 108 for efficient power transfer.

Transmission coils 106, and possibly receive coils 108, are cooled by ion cooling engine (ICE) 150, possibly controlled by transmitting device 102. ICE 150 includes a high-voltage (HV) circuit 160 (ion fan) that uses a high voltage, possibly of a few kilovolts, to generate an ion beam that generates airflow ("wind") 164 that cools coils 106 and/or 108. A low voltage (LV) ICE circuit 180 provides an interface between transmitting device 102 and HV circuit 160.

Figure 2A:
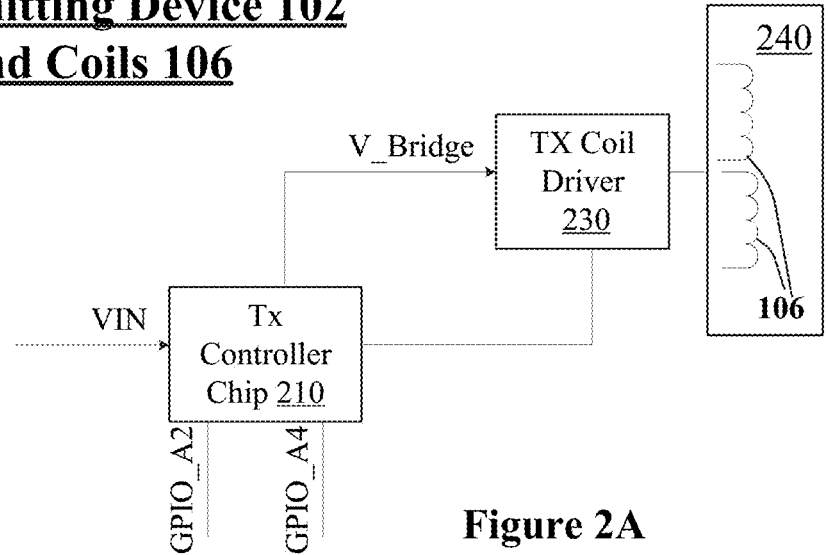
FIGS. 2A and 2B further illustrate a wireless power transmitter with an ICE circuit in accordance with some embodiments.
Figure 2B:
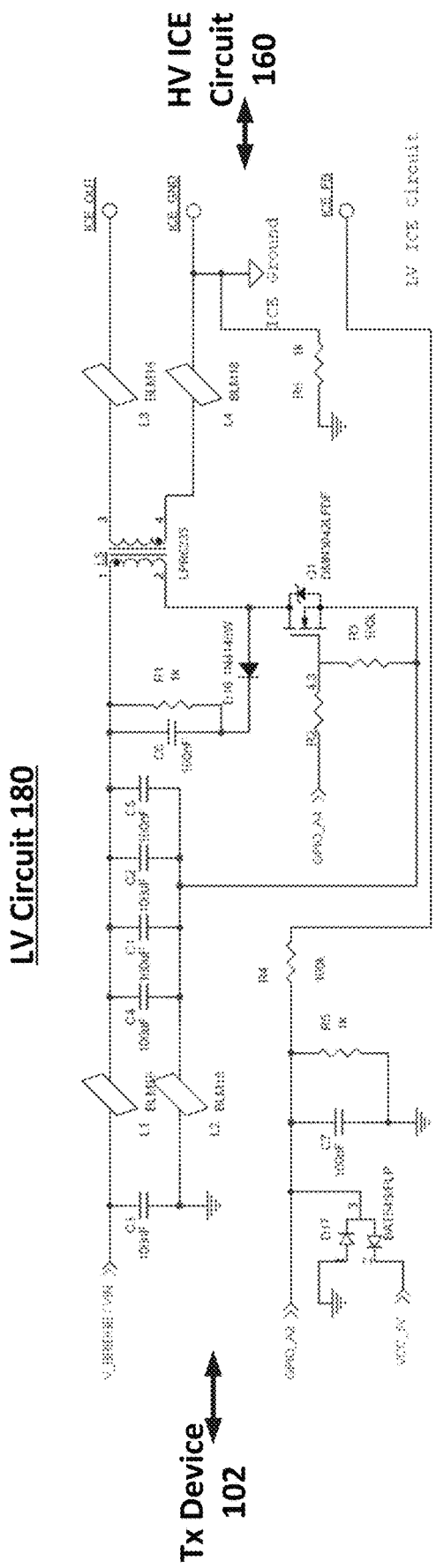

FIG. 2A illustrates a transmit circuit configuration according to some embodiments. FIG. 2B illustrates LV circuit 180 according to some embodiments. In the examples of FIGS. 2A and 2B, transmitting device 102 is controlled by a transmitter controller chip 210. In some embodiments, chip 210 is of type P9236 (Trademark) available from Integrated Device Technology, Inc. of the United States of America.

Tx controller 210 receives a DC voltage VIN, which can be 4.5V to 5.0V for example, and generates a DC voltage V_BRIDGE, of a similar value to VIN, for Tx coil driver 230. Tx Coil Driver 230 convert the V_BRIDGE voltage to AC current. A circuit 240 uses this current to drive the transmit coils 106.

LV circuit 180 of FIG. 2B includes inductances (e.g. ferrite beads) L1, L2, L3, L4 for filtering out high-frequency noise in its VIN or V_BRIDGE input signal; and includes a transformer L5; capacitors C1, C2, etc.; a transistor Q1; and resistors and diodes as illustrated. LC circuit 180 is coupled to receive power (any one of V_BRIDGE or VIN; and also VCC_5V, and ground) from transmitting device 102. The GPIO_A2 and GPIO_A4 terminals (FIGS. 2A and 2B) are programmable inputs/outputs of TX controller chip 210, and are programmed (by programming the TX controller) as described below.

LV circuit 180 provides a high voltage AC signal ICE_OUT and an ICE ground voltage ICE_GND to HV circuit 160. HV circuit 160 can be mounted on a separate, high-voltage board.

LV circuit 180 receives a feedback signal ICE_FB from HV circuit 160. The feedback signal is indicative of the voltage in the ion beam generated by HV circuit 160. The feedback signal is used to provide a signal to the TX controller chip 210 through terminal GPIO_A2.

The signal GPIO_A4 is generated by TX controller 210 to control transistor Q1 (FIG. 2B). Transistor Q1 is connected in series with the primary coil of transformer L5 between the input voltage V_BRIDGE/VIN and ground. Signal GPIO_A4 repeatedly turns the transistor Q1 on and off to generate controlled AC current through the primary coil. The transformer's secondary coil has one end coupled, through inductance L3, to the ICE_OUT output; and the other end coupled, through inductance L4, to the ICE_GND output, which in turn is coupled to ground through resistor R6. The transistor Q1 gate is controlled at variable fixed frequencies and variable duty cycle used to create a HV used to create the ICE air-flow (may be controlled as PWM square wave or some other type of AC signal).

If the GPIO_A4 signal is high for a long time (causing Q1 to turn ON), then VIN (or V_BRIDGE) can be shorted to GND after a short period of time (~50 us, once the L5 primary coil saturates). In some embodiments, TX chip 210 can monitor VIN and, if the voltage drop exceeds a threshold value (e.g., ~0.25V) the GPIO_A4 signal can be emergency dropped to 0V to prevent VIN voltage rail collapse. This shorting creates high current in the step-up transformer (L5) low-voltage side (primary) and the magnetic field generates the HV on the secondary (HV) side of the step-up transformer.

In some embodiments, an inductive kick-back and snubber circuit is included in LV circuit 180 to provide for EMI suppression and Q1 protection when the Q1 FET is changed from ON to OFF resulting in the sudden loss of current path. This inductive kick-back and snubber circuit is illustrated in FIG. 2B as diode D16, resistor R1, and capacitor C6.

Further, by monitoring the ICE high voltage divider voltage (at the junction of R4 and R5) reflecting the feedback voltage ICE_FB, the signal GPIO_A2 can provide the status of the high-voltage ICE circuit 160. If the signal goes to a very low voltage while the ICE fan 160 is on, a fault condition is indicated (short to Earth GND or some other point outside the ICE module 150). This signal is also used to adjust the HV level to control the ICE airflow.

Figure 3:
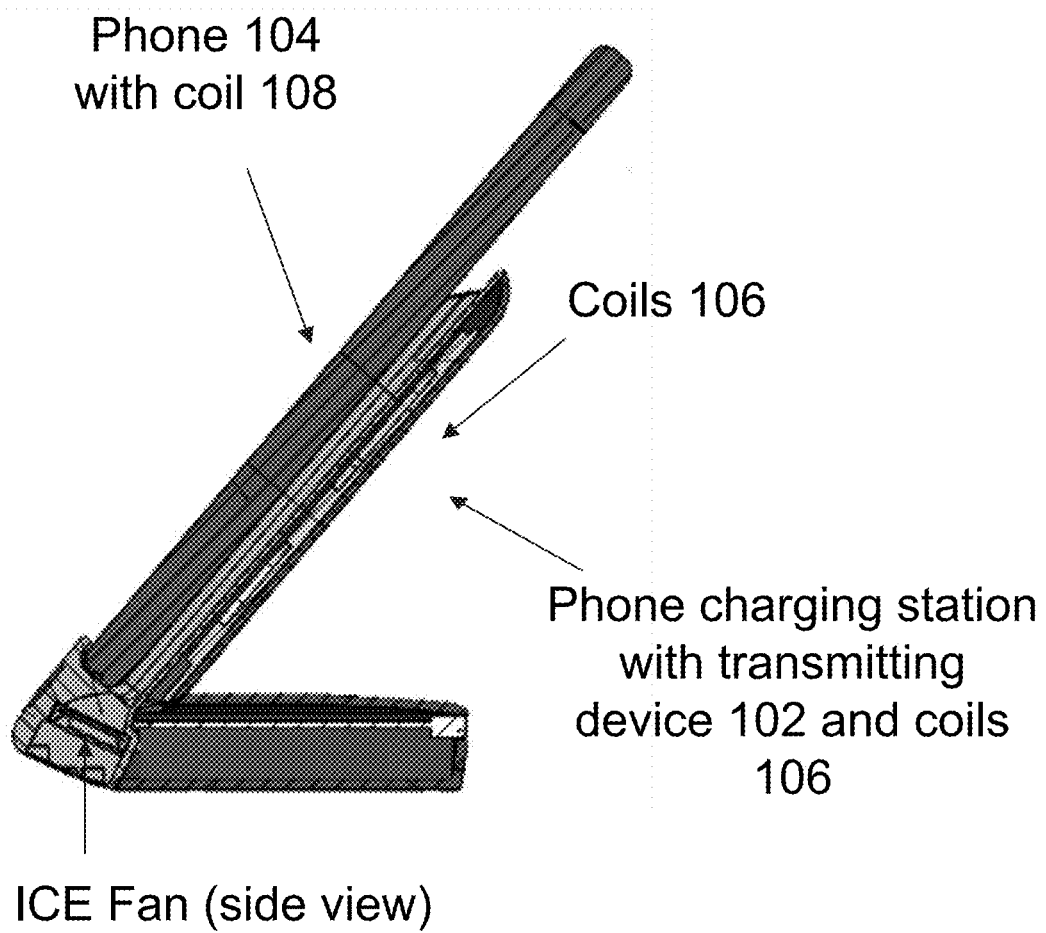
FIG. 3 illustrates a charging system with an ICE fan.

FIG. 3 illustrates a charging station with an ICE engine 150 built in. Receiving device 104 is a mobile phone. Coils 106, 108 are mounted such that when the phone 104 is held in the cradle of transmitting device 102, the phone's coil 108 is aligned with one or more transmit coils 106. ICE fan 160 is provided to cool the system. ICE fan 160 can be controlled based on battery 105 temperature of the phone being charged.

In some embodiments, the phone or other device 104 being charged can send the battery 105 temperature to transmitting device 102 during charging, and ICE 150 can be controlled by the transmit chip 210 based on battery temperature to minimize battery heating. The temperature is controlled with airflow 164 control (higher temperatures will result in higher airflow 164, lower temperatures can result in reduced airflow).

For receiving devices 104 that do not report the battery temperature, the transmitter 102 can control airflow based on the temperature of the Tx coil(s) 106, receive coil(s) 108 and the Reported Power Packet (RPP). RPP is transmitted by receiving device 102 to report to the transmitter the wireless power being received. Higher RPP means higher power, so higher airflow is needed. Additionally, when the charging state approaches full-charge, the efficiency reduces which often results in higher temperature, so the airflow is increased when the charging state approaches full-charge.

Furthermore, temperature can be used for foreign object detection (FOD) or to detect a blockage of ICE fan 160. Regarding foreign object detection, consider a system that uses the ICE fan 160 to cool the transmission coils 106. By measuring ambient temperature, Tx coil 106 temperature, or battery 105 temperature and storing this information in a computer memory (not shown) and analyzing this information, the presence of a foreign object (FO) can be detected when conditions occur such as Tx 102 transmitted power increases but RPP power stays the same and the temperatures do not change, or the RPP power and/or the temperatures increase but the increases are too small for the corresponding Tx 102 power increase. This is a signature data indication of FO presence. Indeed, if the Tx power increases, then the battery 105 temperature should also increase. If the battery temperature stays the same or does not increase correspondingly, that may be because some of the Tx power is absorbed by a FO. Another possible reason for the abnormal battery temperature behavior is misalignment between the transmit and receive coils 106, 108.

ICE fan 160 blockage can be detected by TX chip 210 from a voltage sensor signal on terminal GPIO_A2 as illustrated in FIG. 2B. Specifically, a blockage of airflow 164 may cause the ion beam voltage to increase. Consequently, the ICE_FB voltage may increase, resulting in the increased voltage on terminal GPIO_A2.

In some cases, when a blockage or other fault or abnormal condition described above is detected, the transmitting device 102 can send an alarm to the receiver (e.g. phone) 104 to initiate alarm at the phone 104 or at some host device coupled to phone 104, so that the blockage or other abnormal condition can be cleared. Additionally or in alternative, the transmitting device 102 may reduce the Tx power transmitted by the coils 106, possibly to zero (i.e. interrupting the wireless power transfer).

Some embodiments of the invention are defined by the following clauses. In the clauses, the parenthetical remarks are for illustration only and do not limit the clauses.

Clause 1 defines a wireless power transmitter system, comprising:

one or more transmit coils;

a transmitting device coupled to the one or more transmit coils, for driving the one or more transmit coils to transmit wireless power; and an ion cooling engine coupled to the transmitting device and arranged for cooling the wireless power transmitter system.

2. The wireless power transmitter system of clause 1, wherein the ion cooling engine is arranged for cooling at least one of the transmit and receive coils.

3. The wireless power transmitter system of clause 1 or 2, wherein the ion cooling engine comprises:

a first circuit (e.g. 180) arranged to receive one or more first voltages from the transmitting device and to convert the one or more first voltages to a second voltage (e.g. ICE_OUT to ICE_GND) of a maximum magnitude being at least 100 times greater than a maximum magnitude of any first voltage (e.g. the maximum magnitude of ICE_OUT, or ICE_OUT-ICE_GND, can be at least one kilovolts, and when the maximum magnitude of VIN or V_BRIDGE is 5.0V); and a second circuit (e.g. 180) for using the second voltage to generate an ion beam for generating an airflow to be emitted by the cooling engine.

4. The wireless power transmitter system of clause 3, wherein the one or more first voltages are DC voltages, and the second voltage is an AC voltage.

5. The wireless power transmitter system of clause 3 or 4, wherein a drop of at least one first voltage corresponds to a drop of a power supply voltage, and the transmitting device is configured to disrupt conversion of the one or more first voltages to the second voltage in response to a drop of the power supply voltage below a threshold value (e.g. disrupting the conversion may include turning off the transistor Q1).

6. The wireless power transmitter system of clause 5, wherein the first circuit comprises a transformer whose primary winding is coupled in series with a transistor between a terminal for receiving at least one first voltage and a ground terminal; and disrupting the conversion of the one or more first voltages to the second voltage comprises turning off the transistor in response to the drop of the power supply voltage below the threshold value.

7. The wireless power transmitter system of any preceding clause, wherein the transmitting device is coupled to monitor a feedback signal (e.g. ICE_FB) from the ion cooling engine, the feedback signal being indicative a voltage of an ion beam generated by the ion cooling engine, the transmitting device being configured to monitor the feedback signal to detect a fault (e.g. generate an alarm if the feedback signal is abnormally high or abnormally low; the feedback signal is also used to regulate the ICE airflow).

8. The wireless power transmitter system of clause 7, wherein the transmitting device is configured to generate an alarm signal when the feedback signal indicates an abnormally high voltage in the ion beam.

9. The wireless power transmitter system of clause 7 or 8, wherein the transmitting device is configured to reduce the wireless power transmitted by the one or more transmit coils when the voltage of the feedback signal indicates an abnormally high voltage in the ion beam.

10. The wireless power transmitter system of any preceding clause, wherein the transmitting device is configured to control airflow from the ion cooling engine in response to a temperature of a battery being charged in a wireless power receiver system.

11. The wireless power transmitter system of any preceding clause, wherein the transmitting device is configured to control airflow from the ion cooling engine in response to a temperature of at least one transmit coil.

12. The wireless power transmitter system of any preceding clause, wherein the transmitting device is configured to reduce airflow when a device being charged by the wireless power approaches a full-charge state.

13. The wireless power transmitter system of any preceding clause, wherein the transmitting device is configured to control airflow from the ion cooling engine in response to a received-power report from a wireless power receiver system.

14. The wireless power transmitter system of any preceding clause, wherein the transmitting device is configured to detect a foreign object based on matching the wireless power transmitted by the wireless power transmitter system, and at least one of: (i) ambient temperature, (ii) a temperature of at least one of the transmit and receive coils, (iii) a temperature of a battery being charged by the wireless power.

15. The wireless power transmitter system of any preceding clause, wherein the transmitting device is configured to detect a foreign object based on matching the wireless power transmitted by the wireless power transmitter system, and a temperature of a battery being charged by the wireless power.

16. The wireless power transmitter system of any preceding clause, wherein the transmitting device is configured to detect a misalignment between at least one transmit coil and at least one receive coil based on matching the wireless power transmitted by the wireless power transmitter system, and at least one of: (i) ambient temperature, (ii) a temperature of at least one of the transmit and receive coils, (iii) a temperature of a battery being charged by the wireless power.

17. The wireless power transmitter system of any preceding clause, wherein the transmitting device is configured to detect a misalignment between at least one transmit coil and at least one receive coil based on matching the wireless power transmitted by the wireless power transmitter system, and a temperature of a battery being charged by the wireless power.

18. A wireless power transmitter system, comprising:
one or more transmit coils;
a transmitting device coupled to the one or more transmit coils, for driving the one or more transmit coils to transmit wireless power; and
an ion cooling engine coupled to the transmitting device and arranged for cooling at least one of the wireless power transmitter system and an associated wireless power receiver system.

19. A method for transmitting wireless power, the method comprising:
generating wireless power by one or more transmit coils driven by a transmitting device; and
generating an airflow by an ion cooling engine coupled to the transmitting device, the airflow cooling at least one of: (1) a wireless power transmitter system comprising the one or more transmit coils and the transmitting device; (2) a wireless power receiver system comprising one or more receive coils receiving wireless power from the one or more transmit coils.

20. The method of clause 19, wherein the airflow cools at least one of the transmit and receive coils.

The above detailed description is provided to illustrate specific embodiments of the present invention and is not intended to be limiting. Numerous variations and modifications within the scope of the present invention are possible. The present invention is set forth in the following claims.

What is claimed is:

1. A wireless power transmitter system, comprising:
one or more transmit coils;
a transmitting device coupled to the one or more transmit coils, the transmitting device configured to drive the one or more transmit coils to transmit wireless power; and
an ion cooling engine coupled to the transmitting device and configured to cool at least one of: (1) the wireless power transmitter system, or (2) a wireless power receiver system when coupled to the wireless power transmitter system to receive power at one or more receive coils from the wireless power transmitter system, the ion cooling engine comprising
a first circuit arranged to receive one or more first voltages from the transmitting device and to convert the one or more first voltages to a second voltage of a maximum magnitude being at least 100 times greater than a maximum magnitude of any first voltage, and a second circuit for using the second voltage to generate an ion beam for generating an airflow to be emitted by the cooling engine.

2. The wireless power transmitter system of claim 1, wherein the ion cooling engine is configured to cool at least one of the transmit and receive coils.

3. The wireless power transmitter system of claim 1, wherein the one or more first voltages are DC voltages, and the second voltage is an AC voltage.

4. The wireless power transmitter system of claim 1, wherein a drop of at least one first voltage corresponds to a drop of a power supply voltage, and the transmitting device is configured to disrupt conversion of the one or more first voltages to the second voltage in response to a drop of the power supply voltage below a threshold value.

5. The wireless power transmitter system of claim 4 wherein the first circuit comprises a transformer whose primary winding is coupled in series with a transistor between a terminal for receiving at least one first voltage and a ground terminal; and
   disrupting the conversion of the one or more first voltages to the second voltage comprises turning off the transistor in response to the drop of the power supply voltage below the threshold value.

6. A wireless power transmitter system, comprising:
   one or more transmit coils;
   a transmitting device coupled to the one or more transmit coils, the transmitting device configured to drive the one or more transmit coils to transmit wireless power; and
   an ion cooling engine coupled to the transmitting device and configured to cool at least one of: (1) the wireless power transmitter system, or (2) a wireless power receiver system when coupled to the wireless power transmitter system to receive power at one or more receive coils from the wireless power transmitter system,
   wherein the transmitting device is coupled to monitor a feedback signal from the ion cooling engine, the feedback signal being indicative of a voltage of an ion beam generated by the ion cooling engine, the transmitting device being configured to monitor the feedback signal to detect a fault.

7. The wireless power transmitter system of claim 6, wherein the transmitting device is configured to generate an alarm signal when the feedback signal indicates an abnormally high voltage in the ion beam.

8. The wireless power transmitter system of claim 6, wherein the transmitting device is configured to reduce the wireless power transmitted by the one or more transmit coils when the voltage of the feedback signal indicates an abnormally high voltage in the ion beam.

9. The wireless power transmitter system of claim 1, wherein the transmitting device is configured to control airflow from the ion cooling engine in response to a temperature of a battery being charged in a wireless power receiver system.

10. The wireless power transmitter system of claim 1, wherein the transmitting device is configured to control airflow from the ion cooling engine in response to a temperature of at least one transmit coil.

11. The wireless power transmitter system of claim 1, wherein the transmitting device is configured to reduce airflow when a device being charged by the wireless power approaches a full-charge state.

12. The wireless power transmitter system of claim 1, wherein the transmitting device is configured to control airflow from the ion cooling engine in response to a received-power report from a wireless power receiver system.

13. The wireless power transmitter system of claim 1, wherein the transmitting device is configured to detect a foreign object based on matching the wireless power transmitted by the wireless power transmitter system, and at least one of: (i) ambient temperature, (ii) a temperature of at least one of the transmit and receive coils, (iii) a temperature of a battery being charged by the wireless power.

14. The wireless power transmitter system of claim 1, wherein the transmitting device is configured to detect a foreign object based on matching the wireless power transmitted by the wireless power transmitter system, and a temperature of a battery being charged by the wireless power.

15. The wireless power transmitter system of claim 1, wherein the transmitting device is configured to detect a misalignment between at least one transmit coil and at least one receive coil based on matching the wireless power transmitted by the wireless power transmitter system, and at least one of: (i) ambient temperature, (ii) a temperature of at least one of the transmit and receive coils, (iii) a temperature of a battery being charged by the wireless power.

16. The wireless power transmitter system of claim 1, wherein the transmitting device is configured to detect a misalignment between at least one transmit coil and at least one receive coil based on matching the wireless power transmitted by the wireless power transmitter system, and a temperature of a battery being charged by the wireless power.

17. A wireless power transmitter system, comprising:
   one or more transmit coils;
   a transmitting device coupled to the one or more transmit coils, for driving the one or more transmit coils to transmit wireless power; and
   an ion cooling engine coupled to the transmitting device and arranged for cooling at least one of the wireless power transmitter system and an associated wireless power receiver system, the ion cooling engine comprising
   a first circuit arranged to receive one or more first voltages from the transmitting device and to convert the one or more first voltages to a second voltage of a maximum magnitude being at least 100 times greater than a maximum magnitude of any first voltage, and
   a second circuit for using the second voltage to generate an ion beam for generating an airflow to be emitted by the cooling engine.

18. A method for transmitting wireless power, the method comprising:
   generating wireless power by one or more transmit coils driven by a transmitting device; and
   generating an airflow by an ion cooling engine coupled to the transmitting device, the airflow cooling at least one of: (1) a wireless power transmitter system comprising the one or more transmit coils and the transmitting device; (2) a wireless power receiver system comprising one or more receive coils receiving wireless power from the one or more transmit coils,
   wherein the ion cooling engine comprises
   a first circuit arranged to receive one or more first voltages from the transmitting device and to convert the one or more first voltages to a second voltage of a maximum magnitude being at least 100 times greater than a maximum magnitude of any first voltage, and a second circuit for using the second voltage to generate an ion beam for generating an airflow to be emitted by the cooling engine.

19. The method of claim 18, wherein the airflow cools at least one of the transmit and receive coils.

\* \* \* \* \*